United States Patent
Kawamura et al.

[11] Patent Number: 5,892,207
[45] Date of Patent: Apr. 6, 1999

[54] HEATING AND COOLING APPARATUS FOR REACTION CHAMBER

[75] Inventors: Hideki Kawamura, Hyogo-ken; Hirochika Yamamoto, Ibaragi-ken; Yukinobu Nishikawa, Tokyo, all of Japan

[73] Assignee: Teisan Kabushiki Kaisha, Tokyo, Japan

[21] Appl. No.: 758,246

[22] Filed: Nov. 27, 1996

[30] Foreign Application Priority Data

Dec. 1, 1995 [JP] Japan .................. 7-335657

[51] Int. Cl.$^6$ .................. B23K 10/00
[52] U.S. Cl. .............. 219/492; 219/121.43; 219/121.49; 118/724; 204/298.09
[58] Field of Search ............. 219/121.4, 121.43, 219/121.52, 121.44, 121.49, 492, 497; 148/723 R, 724, 725; 204/298.09, 308, 298.31; 156/646.1, 345

[56] References Cited

U.S. PATENT DOCUMENTS

| | | | |
|---|---|---|---|
| 3,646,243 | 2/1972 | Graneau et al. | 174/15 |
| 3,744,935 | 7/1973 | Magni | 417/366 |
| 4,726,195 | 2/1988 | Klee | 62/62 |
| 4,971,653 | 11/1990 | Powell et al. | 156/626 |
| 5,376,213 | 12/1994 | Ueda et al. | 118/723 E |
| 5,414,244 | 5/1995 | Imahashi | 219/497 |
| 5,584,971 | 12/1996 | Komino | 204/192.13 |
| 5,589,041 | 12/1996 | Lantsman | 204/192.33 |
| 5,591,269 | 1/1997 | Arami et al. | 118/723 R |

FOREIGN PATENT DOCUMENTS

| | | |
|---|---|---|
| 0436070A1 | 10/1991 | European Pat. Off. . |
| 1515303 | 4/1969 | Germany . |
| 60-245778 | 5/1985 | Japan . |
| 1004739 | 9/1965 | United Kingdom . |

*Primary Examiner*—Mark H. Paschall
*Attorney, Agent, or Firm*—Burns, Doane, Swecker & Mathis, L.L.P.

[57] ABSTRACT

The present invention relates to a temperature regulation apparatus capable of easily regulating the temperature of a support for a substance to be treated, such as a semiconductor wafer.

The temperature regulation apparatus includes a liquid nitrogen supply device for supplying liquid nitrogen into a temperature regulation space provided in the inside of a support so as to effect flashing of the liquid nitrogen. A heating device for heating the support and temperature sensors for detecting the temperature of the support are also provided. A temperature setting device sets the temperature of the support at a desired temperature and a controller controls the liquid nitrogen supply device and the heating device based on a temperature detected by the temperature sensors, so that the support reaches and is maintained at the set temperature.

17 Claims, 1 Drawing Sheet

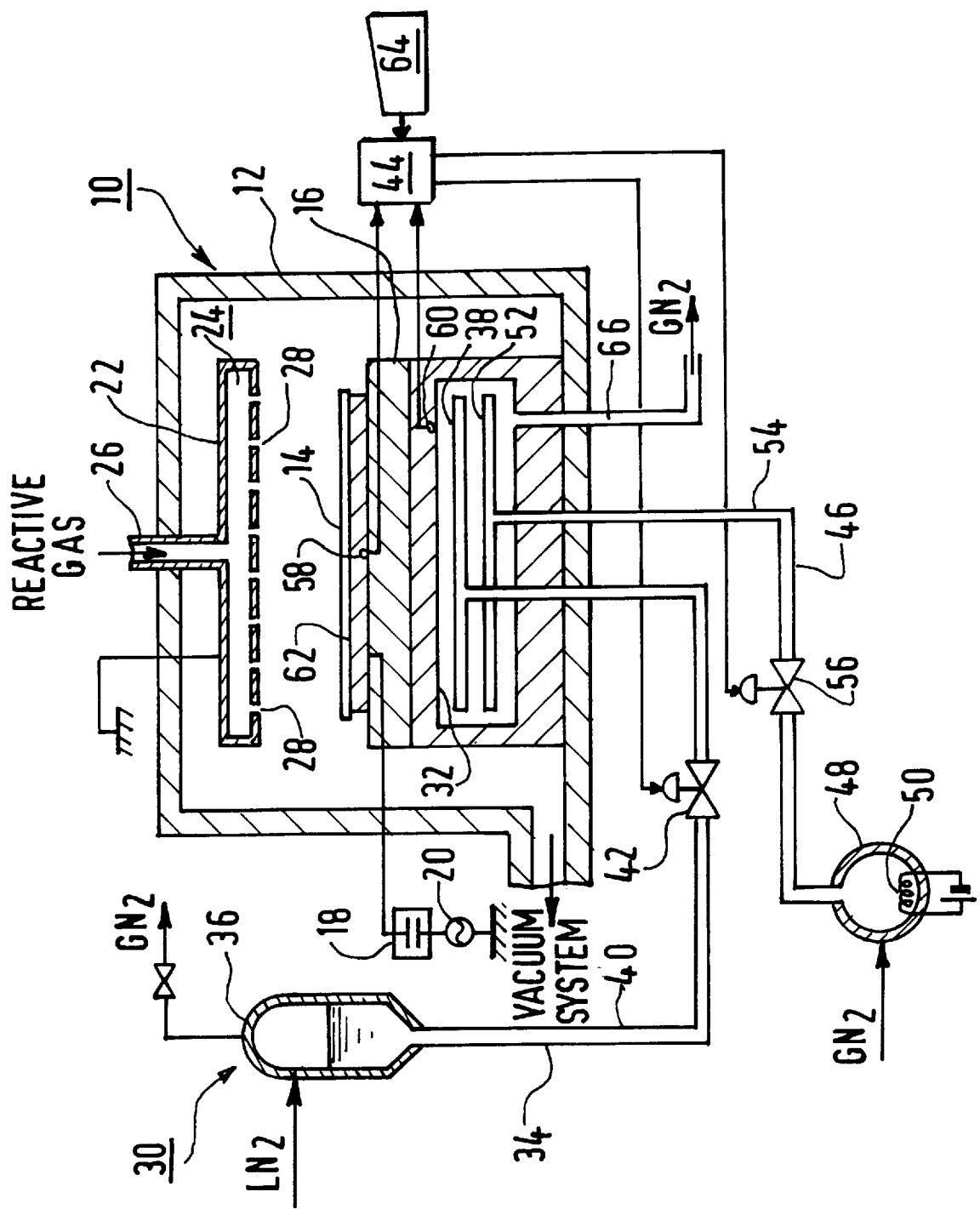

HEATING AND COOLING APPARATUS FOR REACTION CHAMBER

BACKGROUND OF THE INVENTION

1. Field of the Invention

The present invention relates to a treatment unit, for example, an etching unit, spattering unit or CVD unit, and more particularly to a temperature control apparatus for controlling the temperature of a support for a substance to be treated, such as a semiconductor wafer.

2. Brief Description of the Related Art

In the treatment of semiconductor wafers, temperature plays an important role as a conditional factor for treating semiconductor wafers. For instance, in the case of a reactive ion etching (RIE) treatment, it has been known that the anisotropy of etching is improved if a semiconductor wafer is cooled down to $-100°$ C. or less. In a conventional RIE unit, there has therefore been previously developed a means of introducing a liquefied gas, such as liquid nitrogen, to a liquid reservoir in a support for a semiconductor wafer, i.e., a susceptor assembly, to cool down the semiconductor wafer. See, for example, Japanese Patent Application Laid-open (KOKAI) No. 216,076/1994.

The prior art treatment units, however, perform only a single temperature treatment in each unit. Temperature control in prior art treatment units therefore has not been performed with large variations in the treatment temperature. The prior art treatment units thus have taken long periods of time to continuously carry out different kinds of heat treatments in one treatment unit.

It is therefore an object of the present invention to provide a treatment unit which overcomes the deficiencies in the prior art by providing a treatment unit which is capable of quickly controlling the temperature of the treatment unit over

SUMMARY OF THE INVENTION

In accordance with the foregoing objectives, the present invention provides a treatment unit for semi-conductor wafers including a support to support the wafer and a temperature controller to control the temperature of the wafer during a treatment process carried out in the unit. The temperature controller comprises a cooling substance supply device for supplying a cooling substance into a temperature controlled space provided inside of the support, the cooling substance supply device flashing the cooling substance inside the space. A heating device is also provided which heats the support. The device also includes at least one temperature sensor for measuring the temperature of the support and a temperature setting device for setting the temperature of the support at a desired temperature. A controller controls at least one of the cooling substance supply device and the heating device based on the temperature measured by the at least one temperature sensor and obtains the desired temperature of the support by selectively supplying the cooling substance to the support when its temperature is higher than the desired temperature and heating the support when its temperature is lower than the desired temperature.

According to another embodiment of the invention, a treatment unit for a substance comprises a housing, a support including a substance supporting surface, the support located within the housing for supporting a substance on the substance supporting surface, means for cooling the support in heat transfer communication with the support, and means for heating the support in heat transfer communication with said support.

According to yet another embodiment of the invention, a method for controlling the temperature of a substance in a treatment chamber during a treatment process comprises the steps of sensing the temperature of a support, the substance being in heat transfer communication with said support, cooling the support if the temperature is above a desired temperature, and heating the support if the temperature is below the desired temperature.

BRIEF DESCRIPTION OF THE DRAWING

The invention will be described in greater detail with reference to the accompanying drawing, wherein FIG. 1 is a schematic view of a treatment unit according to one embodiment of the invention.

DETAILED DESCRIPTION OF PREFERRED EMBODIMENTS

FIG. 1 is a schematic drawing illustrating a RIE unit according to one embodiment of the present invention. RIE unit 10 includes a treatment chamber 12, the interior of which is in fluid connection with a vacuum system (not shown). In treatment chamber 12, a susceptor assembly or support 16 is provided for supporting a semiconductor wafer 14 mounted on the support. Susceptor assembly 16 is connected to a high frequency power source 20 through a matching device 18 and functions as a cathode. Above susceptor assembly 16, an electrode 22 is arranged at a predetermined distance from assembly 16. Electrode 22 is grounded so as to function as an anode. Electrode 22 is made as a hollow structure, including an inner space 24 communicating with a reactive gas supply source (not shown) by way of a pipe 26. A reactive gas supplied from the reactive gas supply source to inner space 24 of electrode 22 is introduced into treatment chamber 12 through a number of small holes 28 formed on the bottom surface of the electrode.

When the inside of treatment chamber 12 is reduced in pressure to, for example, $10^{-2}$ Torr ($1.33 \times 10^3$ KPa) or less, a reactive gas is introduced into the treatment chamber. The reactive gas may be, but is not limited to, $CF_4$. A high frequency voltage is applied between electrode 22 and susceptor assembly 16, igniting the reactive gas to its plasma state and producing activated species such as ions and radicals. Since susceptor assembly 16 is given a negative voltage, the activated species such as the produced ions are forced in a direction toward susceptor assembly 16 and to etch semiconductor wafer 14 on the susceptor assembly.

A temperature control apparatus 30 according to the present invention includes a cooling substance, e.g., liquid nitrogen, supply device 34 for supplying liquid nitrogen into a temperature control space 32 formed in susceptor assembly 16. Liquid nitrogen supply device 34 in the embodiment illustrated in the drawing preferably includes a gas-liquid separator 36, into which liquid nitrogen is introduced, disposed outside of treatment chamber 12, and a flash disc 38 disposed in temperature control space 32. Gas-liquid separator 36 and flash disc 38 are connected with each other by a vacuum-jacketed pipe 40 so that nitrogen in the gasliquid separator is sent to the flash disc in liquid phase only, thereby maintaining a very low temperature. Flash disc 38 has a number of liquid injection holes (not shown) formed on its top surface, as seen in FIG. 1, where the liquid nitrogen sent to the flash disc is caused to flash upwards from the liquid injection holes.

Vacuum-jacketed pipe 40 includes an electromagnetic valve 42. Electromagnetic valve 42 is preferably controlled by control signals from a controller 44. Controller 44 may be, but is not limited to, a microcomputer.

Temperature control apparatus 30 also includes a high temperature nitrogen gas supply device 46 for supplying high temperature nitrogen gas into temperature control space 32 of susceptor assembly 16. High temperature nitrogen gas supply device 46 includes a nitrogen gas tank 48 preferably disposed outside of treatment chamber 12 into which nitrogen gas is introduced. A heating device 50, such as an electric heater, is disposed inside nitrogen gas tank 48 in order to heat nitrogen gas introduced therein to a high temperature. High temperature nitrogen gas supply device 46 includes a nitrogen gas release disc 52 disposed in temperature control space 32. Nitrogen gas release disc 52 and nitrogen gas tank 48 are connected with each other by an insulated pipe 54. Insulated pipe 54 preferably includes a solenoid valve 56. Solenoid valve 56 is also controlled by controller 44.

Temperature sensors 58, 60 are provided for sensing the temperature of susceptor assembly 16 and are connected to controller 44. In the illustrated embodiment, temperature sensors 58, 60 are disposed at two places, i.e., in the vicinity of a wafer-supporting face 62 of susceptor assembly 16 and in the vicinity of temperature control space 32. Controller 44 calculates the temperature of wafer-supporting face 62 based on at least the temperature signals from temperature sensors 58, 60. Controller 44 includes an input device 64 connected thereto for setting a desired treatment temperature. Input device 64 may be, but is not limited to, a keyboard.

A treatment temperature control method will now be described with reference to FIG. 1. In this method, treatment temperature refers to a temperature of wafer supporting face 62 of susceptor assembly 16.

When it is desired that the treatment temperature be a particular temperature, e.g., −100° C., in order to enhance the anisotropy of etching, a set treatment temperature of −100° C. is input from input device 64. After the desired temperature has been set, controller 44 calculates the temperature of wafer-supporting face 62 of the susceptor assembly 16 based at least upon signals from temperature sensors 58, 60. If the temperature of wafer-supporting face 62 is calculated to be over the set temperature (e.g., −100° C.), a solenoid valve control signal will be produced to open solenoid valve 42 and to leave solenoid valve 56 closed. When solenoid valve 42 has been opened, liquid nitrogen is transferred from gas-liquid separator 36 to flash disc 38 through vacuum-jacketed pipe 40 and blown onto the top surface of temperature control space 32 by using the pressure of the nitrogen gas in gas-liquid separator 36 as a driving source. Since very low temperature liquid nitrogen is directly blown onto susceptor assembly 16, susceptor assembly 16 is rapidly cooled down and the semiconductor wafer 14 supported thereon is also cooled down. When the temperature of wafer-supporting face 62 has reached the set temperature as determined by controller 44, controller 44 recognizes, from signals of temperature sensors 58, 60, that the set temperature has been reached, and controls solenoid valve 42 so that the flow of liquid nitrogen to flash disc 38 is stopped or significantly decreased.

An etching treatment is then carried out in treatment chamber 12, as described above. Turning on high frequency power source 20, semiconductor wafer 14 is heated by electric discharge, and hence it is necessary for controller 44 to control solenoid valve 42 to send liquid nitrogen to temperature control space 32 to cool susceptor assembly 16. Liquid nitrogen introduced to temperature control space 32 is evaporated at the same time as it is caused to flow from flash disc 38, from which it is quickly released to the atmosphere by way of a pipe 66.

When it is desired to raise the treatment temperature, a desired temperature is input from input device 64 into controller 44. After the treatment temperature has been set, controller 44 closes solenoid valve 42 and opens solenoid valve 56. High temperature nitrogen gas is introduced from nitrogen gas tank 48 into temperature control space 32 through insulated pipe 54 and nitrogen gas release disc 52. As a result, the temperature of susceptor assembly 16, and of semiconductor wafer 14 supported thereon, rises. Because the liquid nitrogen previously introduced in temperature control space 32 has been discharged by way of pipe 66, the temperature of susceptor assembly 16 rises rapidly. If the temperature of wafer-supporting face 62 of the susceptor assembly 16 has reached the set temperature, e.g., 20° C., a control signal will be produced from controller 44 so as to close solenoid valve 46. Etching is then performed in treatment chamber 16. Semiconductor wafer 14 is heated as described above and the temperature of the wafer-supporting face 62 potentially then exceeds the set temperature, e.g., 20° C. If the temperature of wafer-supporting face 62 exceeds the set temperature, controller 44 controls solenoid valve 42 so that liquid nitrogen is introduced into temperature control space 32 to keep the treatment temperature constant.

Although an illustrative embodiment of the present invention has been described, the present invention is not limited thereto, and variations may be devised without departing from the spirit of the invention. For example, high temperature nitrogen gas supply device 46 is used as a heating device for heating the susceptor assembly 16. Alternatively, an electric heater, e.g., a heating resistor (not shown), may be embedded in susceptor assembly 16 in place of high temperature nitrogen gas supply device 46. Controller 44 then controls the amount of electricity to be fed to this electric heater.

Although the aforementioned embodiment is of an example where the present invention is applied to a RIE unit, a temperature control apparatus according to the present invention also can be applied to other treatment units, for example, a pressure-reduced CVD unit, a spattering unit, or other types of etching units.

According to the present invention, wafer-supporting face 62 and support 16 can be cooled down to a desired temperature within a short period of time because liquid nitrogen is used as a cooling substance. The discharge of liquid nitrogen from support 16 can be carried out within a short period of time and the switching operation from the cooling mode to the heating mode can be rapidly carried out because the liquid nitrogen introduced to support 16 is flash evaporated. Furthermore, the heating of support 16 also can be performed within a short period of time because there is no liquid nitrogen within temperature control space 32 at the time heating is desired.

A temperature control apparatus according to the present invention controls temperature over a large temperature range and within a short period of time. When it is desired to perform successive treatments at different temperatures, the overall treatment duration can be greatly reduced, whereby the treating capacity and productivity of a treatment unit according to the present invention are vastly improved. Since different kinds of such treatments have been performed in the prior art devices by using a plurality of treatment units, a treatment unit according to the present invention decreases the number of such treatment units which are required to perform multiple treatments.

While the invention has been described in detail with reference to a preferred embodiment thereof, it will be apparent to one of ordinary skill in the art that various changes can be made, and equivalents employed, without depicting from the spirit and scope of the invention.

What is claimed is:

1. A treatment unit for semi-conductor wafers including a support to support said wafer and a temperature controller to control the temperature of said wafer during a treatment process carried out in said unit, wherein said temperature controller comprises:

a cooling substance supply device having a reservoir positioned outside said support for supplying a cooling substance into a temperature controlled space provided inside of said support, said cooling substance supply device further comprising means for flashing said cooling substance in said temperature controlled space, said means for flashing including a flash disk in fluid communication with said reservoir;

a heating device for heating said support;

at least one temperature sensor for measuring the temperature of said support;

a temperature setting device for setting the temperature of said support at a desired temperature;

a controller for controlling at least one of said cooling substance supply device and said heating device based on the temperature measured by said at least one temperature sensor for obtaining said desired temperature of said support by selectively supplying said cooling substance to said support when its temperature is higher than said desired temperature and heating said support when its temperature is lower than said desired temperature;

wherein when said cooling substance supply device supplies said cooling substance from said reservoir to said means for flashing, said cooling substance exits said cooling substance supply device at said flash disk to primarily vaporize said cooling substance in said temperature controlled space to minimize accumulation of a liquid phase of said cooling substance in said temperature controlled space.

2. A treatment unit according to claim 1, wherein said heating device comprises a high temperature nitrogen gas supply device for supplying high temperature nitrogen gas to said support.

3. A treatment unit according to claim 1, wherein said heating device comprises an electric heater provided in said support.

4. A treatment unit for a substance comprising:

a housing;

a support including a substance supporting surface and a temperature control space therein, said support located within said housing for supporting a substance on said substance supporting surface;

means for cooling said support in heat transfer communication with said support, said cooling means comprising a source of a fluid cooling substance positioned outside of said support, a cooling device including a flash disk, and a cooling substance flow path connected between said cooling substance source and said cooling device, said flash disk located within said temperature control space and including a hole for allowing said fluid cooling substance to exit said flash disk into said temperature control space, to primarily vaporize said fluid cooling substance to cool said support to minimize accumulation of a liquid phase of said cooling substance in said temperature control space; and means for heating said support in heat transfer communication with said support.

5. A treatment unit for a substance according to claim 4, further comprising means for introducing a reactive gas into said housing, and means for igniting said reactive gas within said housing to form a plasma.

6. A treatment unit for a substance according to claim 4, further comprising a first temperature sensor to sense the temperature of said substance supporting surface and to generate a first temperature signal.

7. A treatment unit for a substance according to claim 6, further comprising a second temperature sensor to sense a temperature adjacent one of said cooling means and said heating means and to generate a second temperature signal.

8. A treatment unit for a substance according to claim 6, further comprising a controller in communication with said cooling means and said heating means to control said cooling means and said heating means to modify the temperature of said support.

9. A treatment unit for a substance according to claim 8, wherein said controller includes an input device for inputting a desired temperature, said controller controlling said cooling means and said heating means to modify the temperature of said support to be substantially said desired temperature.

10. A treatment unit for a substance according to claim 4, wherein said heating means comprises a source for a heating substance, a heating device in heat transfer communication with said support to allow said heating substance to heat said support, and a heating substance flow path connected between said heating substance source and said heating device.

11. A treatment unit for a substance according to claim 10, wherein said heating device includes a release disk, said support further comprising a temperature control space therein, said release disk located within said temperature control space and including a hole for allowing said heating substance to exit said release disk into said temperature control space to heat said support.

12. A treatment unit for a substance according to claim 4, wherein said heating means comprises an electric heater in heat transfer communication with said support.

13. A treatment unit for a substance according to claim 4, wherein said support further comprises a temperature control space and a vent for said temperature control space, said cooling means comprises means for delivering a supercooled gas to said temperature control space, said heating means comprising means selected from the group consisting of means for delivering a heated gas to said temperature control space and an electric heater in heat transfer communication with said support.

14. A method for controlling the temperature of a substance in a treatment chamber during a treatment process, comprising the steps of:

sensing the temperature of a support, said substance being in heat transfer communication with said support;

cooling said support with a cooling substance delivered from a reservoir outside said support to a temperature control space in said support if said temperature is above a desired temperature by flashing said liquid cooling substance adjacent said support to primarily vaporize and minimize accumulation of said liquid cooling substance in said temperature controlled space; and heating said support if said temperature is below said desired temperature.

15. A method for controlling the temperature of a substance treatment chamber during a treatment process according to claim 14, wherein said step of heating said support comprises selectively exposing said support to a gas which heats said support.

16. A method for controlling the temperature of a substance in a treatment chamber during a treatment process according to claim 14, wherein said step of heating said support comprises heating said support with an electric heater.

17. A method for controlling the temperature of a substance in a treatment chamber during a treatment process according to claim 14, further comprising treating said substance in said treatment chamber while substantially simultaneously cooling said support.

* * * * *